US012712299B2

(12) United States Patent
Ou et al.

(10) Patent No.: US 12,712,299 B2
(45) Date of Patent: Aug. 18, 2026

(54) SERVER AND RISER CABLE HOLDER

(71) Applicant: Wiwynn Corporation, New Taipei City (TW)

(72) Inventors: Hsiang Yu Ou, New Taipei City (TW); Shengwen Tsai, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 345 days.

(21) Appl. No.: 18/544,673

(22) Filed: Dec. 19, 2023

(65) Prior Publication Data

US 2025/0105535 A1 Mar. 27, 2025

(30) Foreign Application Priority Data

Sep. 22, 2023 (TW) ................................ 112136272

(51) Int. Cl.
*H01R 12/70* (2011.01)
*H01R 12/72* (2011.01)
*H01R 12/83* (2011.01)
*H05K 7/14* (2006.01)

(52) U.S. Cl.
CPC ....... *H01R 12/7011* (2013.01); *H01R 12/721* (2013.01); *H01R 12/83* (2013.01); *H05K 7/1405* (2013.01)

(58) Field of Classification Search
CPC .. H01R 12/7011; H01R 12/721; H01R 12/83; H05K 7/1405
USPC ........................................................... 439/79
See application file for complete search history.

(56) References Cited

U.S. PATENT DOCUMENTS

| | | | | |
|---|---|---|---|---|
| 4,995,820 A * | 2/1991 | Prados ................. | H05K 7/1409 | 439/157 |
| 5,470,240 A * | 11/1995 | Suzuki ................. | H01R 12/721 | 439/153 |
| 6,132,228 A * | 10/2000 | Lang ................ | H01R 13/62988 | 439/160 |
| 7,301,777 B2 * | 11/2007 | Fan ...................... | H05K 7/1409 | 361/801 |
| 7,462,060 B2 * | 12/2008 | Hamoignon ......... | H01R 4/2412 | 439/372 |

(Continued)

FOREIGN PATENT DOCUMENTS

| | | |
|---|---|---|
| TW | 404599 U | 9/2000 |
| TW | M251200 U | 11/2004 |

OTHER PUBLICATIONS

TW Office Action dated Jun. 13, 2024 in Taiwan application No. 112136272.

*Primary Examiner* — Gary F Paumen
(74) *Attorney, Agent, or Firm* — McClure, Qualey & Rodack, LLP

(57) ABSTRACT

A server includes a casing, a motherboard, a riser cable holder, a riser cable and an expansion card. The motherboard is located in the casing. The riser cable holder includes a main body, a first holder and a second holder. The main body is fixed in the casing, the first holder and the second holder are respectively connected to different positions of the main body, and the first holder and the second holder are in asymmetric arrangement relative to the main body. The riser cable is mounted on the main body and electrically connected to the motherboard. The first holder and the second holder are detachably engaged with the riser cable. The expansion card is inserted into the riser cable.

19 Claims, 12 Drawing Sheets

(56) References Cited

U.S. PATENT DOCUMENTS

| | | | | |
|---|---|---|---|---|
| 7,559,780 | B2 * | 7/2009 | Mizoguchi | H01R 13/62938 439/157 |
| 8,215,970 | B2 * | 7/2012 | Shamoto | H01R 13/5812 439/157 |
| 8,475,195 | B2 * | 7/2013 | Annis | H01R 12/7029 439/328 |
| 8,535,077 | B2 * | 9/2013 | Shen | H01R 13/639 439/328 |
| 8,636,528 | B2 * | 1/2014 | Sass | H01R 12/7029 439/372 |
| 9,710,421 | B2 * | 7/2017 | Tamarkin | H05K 3/308 |
| 2003/0199185 | A1 * | 10/2003 | Fujii | H01R 13/506 439/157 |
| 2006/0030185 | A1 * | 2/2006 | Hamoignon | H01R 4/2412 439/157 |
| 2016/0190738 | A9 * | 6/2016 | Henmi | H01R 13/62955 439/157 |

* cited by examiner

SERVER AND RISER CABLE HOLDER

CROSS-REFERENCE TO RELATED APPLICATIONS

This non-provisional application claims priority under 35 U.S.C. § 119 (a) on Patent Application No(s). 112136272 filed in Taiwan, R.O.C. on Sep. 22, 2023, the entire contents of which are hereby incorporated by reference.

TECHNICAL FIELD

The disclosure relates a server and a riser cable holder.

BACKGROUND

In servers, a riser cable for an installation of an expansion card is fixed on a support holder via screws, and the support holder is fixed on a casing via screws. However, during the installation/removal of the riser cable from the support holder, the installation/removal of the screws are performed by manpower, which is time-consuming to install/remove the screws and requires an additional tool or fixture. Moreover, electronic components of the server are arranged more compactly, and thus spaces for the tool to reach thereinto to install/remove the screws are insufficient, which is difficult to perform the installation/removal of the riser cable and may increase time spending on the installation/removal of the riser cable. Furthermore, using the screws to fix the riser cable incurs a material cost for the screws. Therefore, how to solve the time-consuming and cost issues associated with using the screws to fix the riser cable is a crucial topic in this field.

SUMMARY

The disclosure provides a server and a riser cable holder configured to reduce installation/removal time of the riser cable and material costs.

One embodiment of the disclosure provides a server. The server includes a casing, a motherboard, a riser cable holder, a riser cable and an expansion card. The motherboard is located in the casing. The riser cable holder includes a main body, a first holder and a second holder. The main body is fixed in the casing, the first holder and the second holder are respectively connected to different positions of the main body, and the first holder and the second holder are in asymmetric arrangement relative to the main body. The riser cable is mounted on the main body and electrically connected to the motherboard. The first holder and the second holder are detachably engaged with the riser cable. The expansion card is inserted into the riser cable.

Another embodiment of the disclosure provides a riser cable holder. The riser cable holder is configured to support a riser cable. The riser cable holder includes a main body, a first holder and a second holder. The main body is configured to support the riser cable. The first holder and the second holder are respectively connected to different positions of the main body, the first holder and the second holder are in asymmetric arrangement relative to the main body, and the first holder and the second holder are configured to be detachably engaged with the riser cable.

According to the server and the riser cable holder as discussed in the above embodiments, the riser cable is installed on the main body of the riser cable holder and held by the first holder and the second holder of the riser cable holder which are in asymmetric arrangement relative to the main body, and thus the riser cable can be removed from/installed on the riser cable holder via a toolless manner. Therefore, compared to a case that a riser cable is fixed to a riser cable holder via screws, this embodiment can save time spending on removing/installing the screws and a tool for removing/installing the screws, reduce the chance in damaging the riser cable during the removal/installation of the screws, and reduce the material cost of screws. In addition, even if the riser cable holder is located at a narrow space, the riser cable can be easily removed from/installed the riser cable holder.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
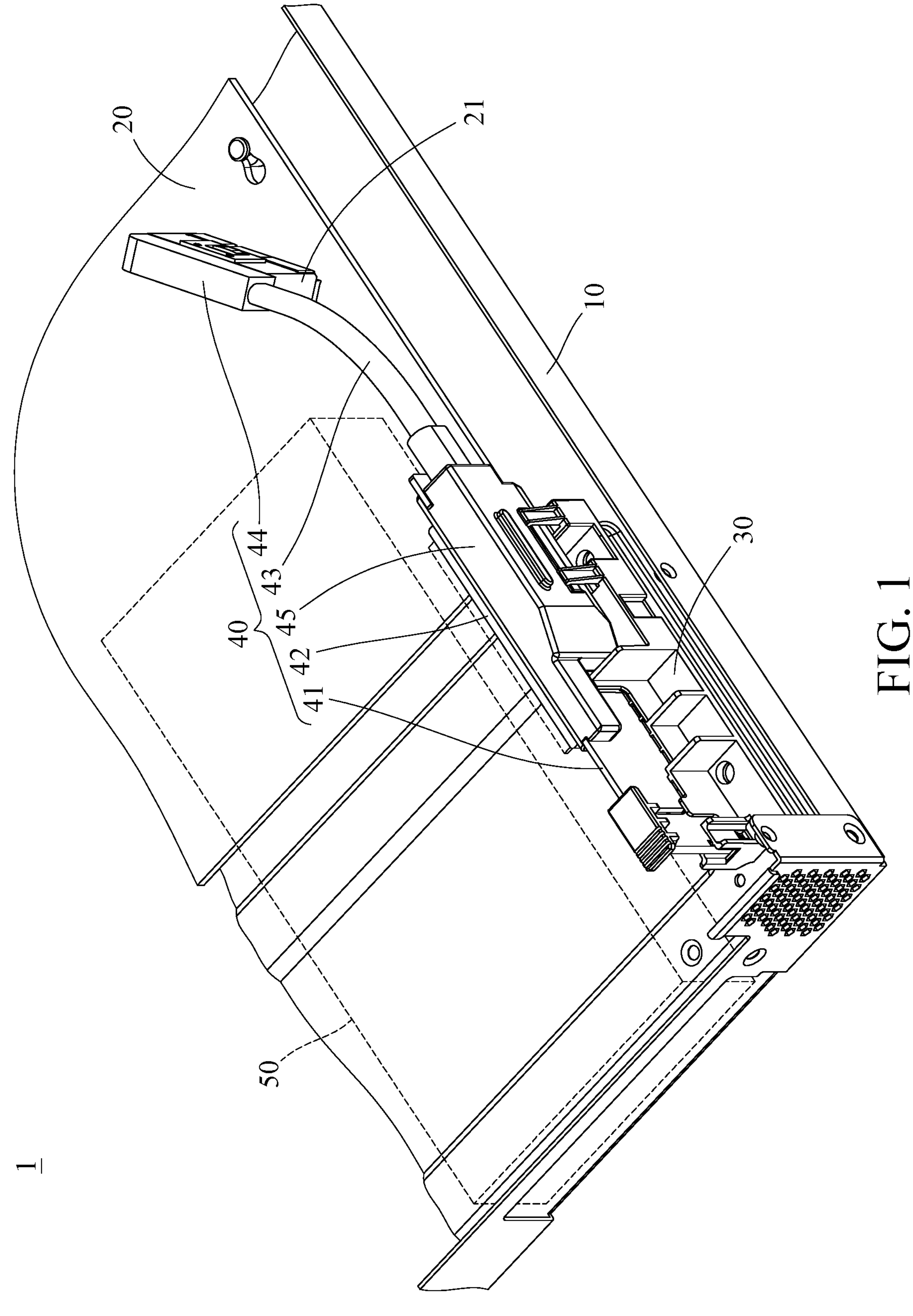
FIG. 1 is a partial perspective view of a server according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
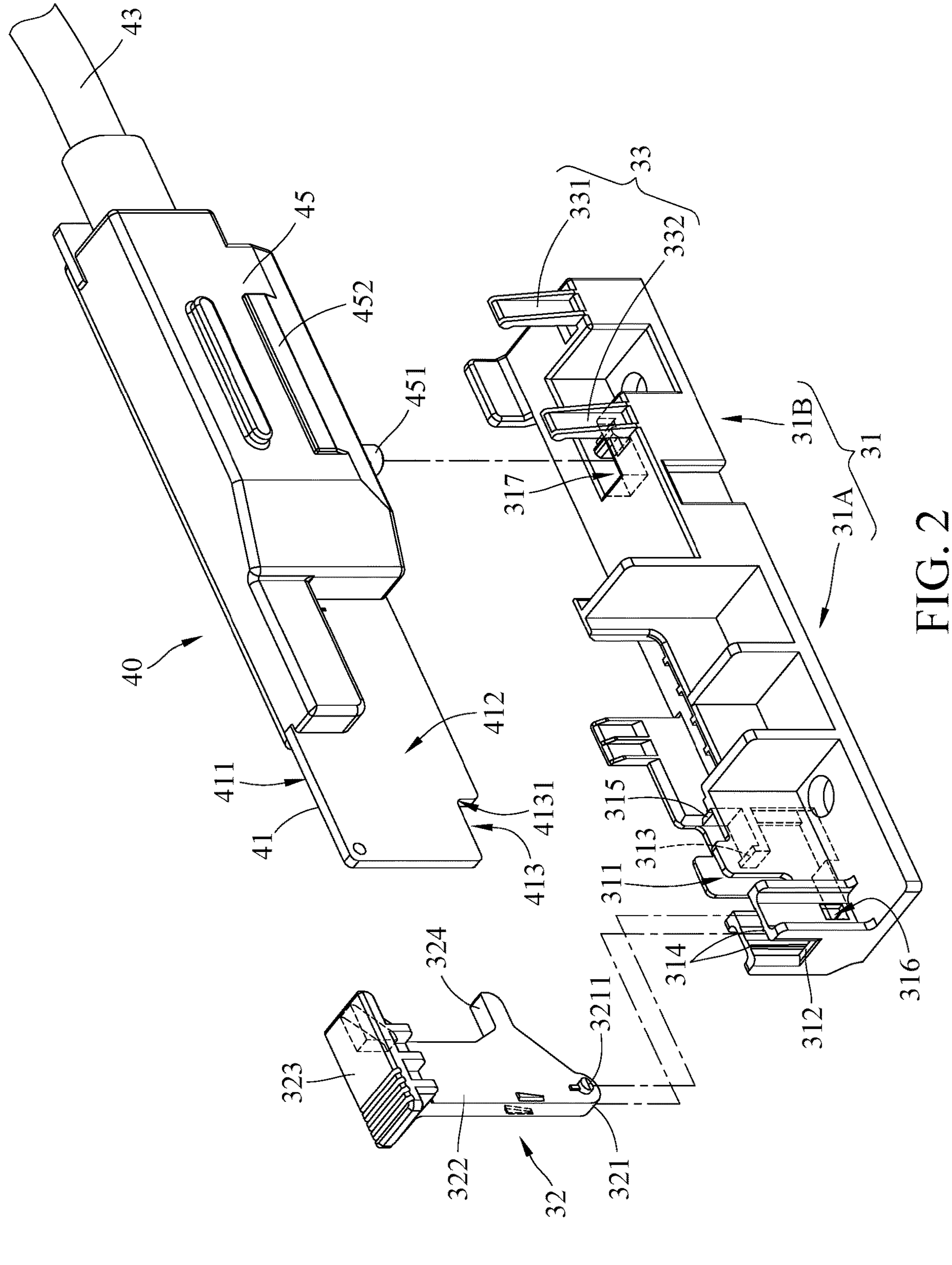
FIG. 2 is an exploded view of a riser cable and a riser cable holder in FIG. 1.
Figure 3:
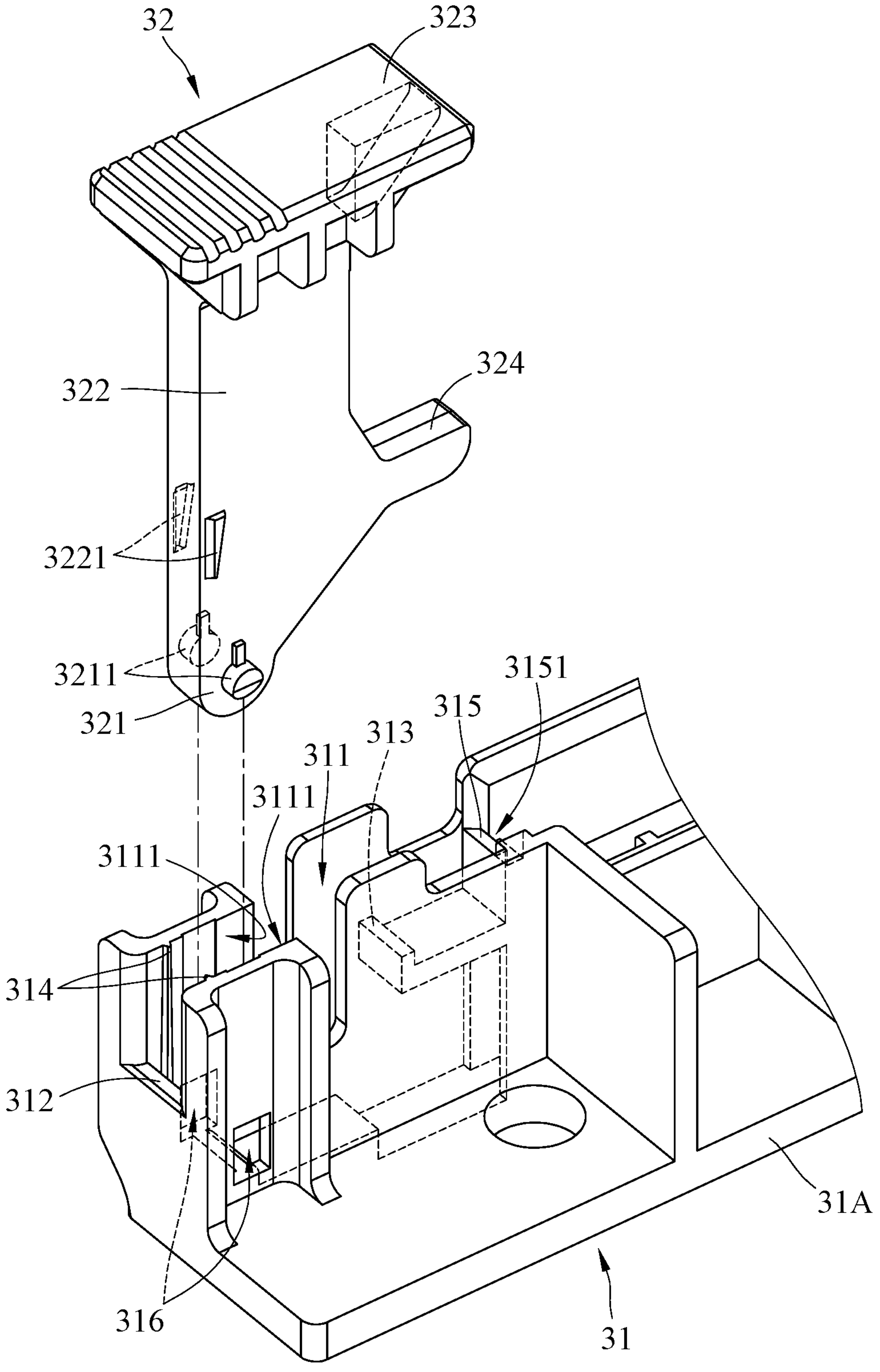
FIG. 3 is a partial and enlarged exploded view of the riser cable holder in FIG. 2.

Referring to FIGS. 1 and 2, FIG. 1 is a partial perspective view of a server 1 according to a first embodiment of the disclosure, and FIG. 2 is an exploded view of a riser cable 40 and a riser cable holder 30 in FIG. 1.

In this embodiment, the server 1 includes a casing 10, a motherboard 20, a riser cable holder 30, a riser cable 40 and an expansion card 50. The motherboard 20 is located in the casing 10 and has an electrical connector 21.

Figure 4:
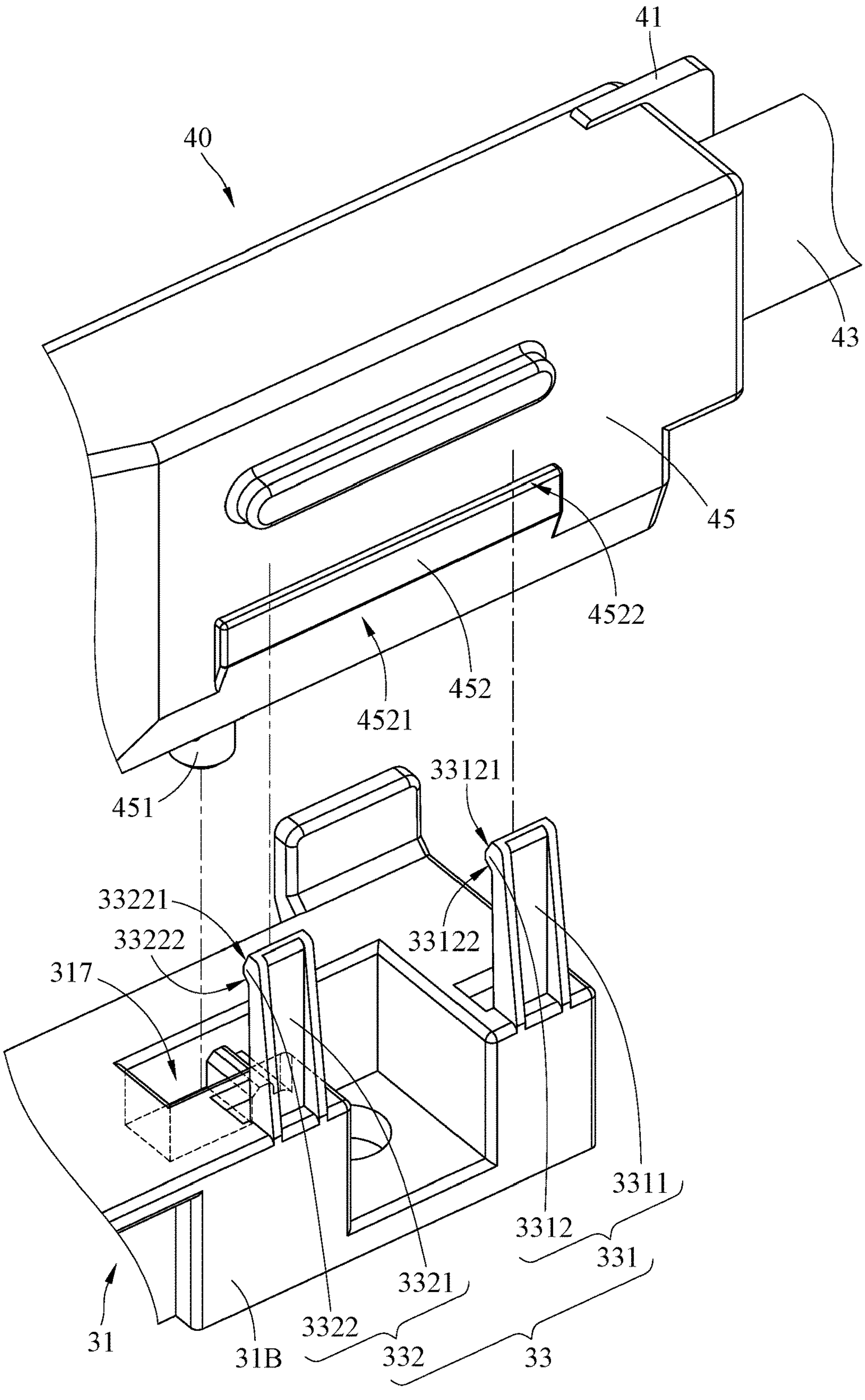
FIG. 4 is a partial and enlarged exploded view of the riser cable holder and the riser cable in FIG. 2.
Figure 5:
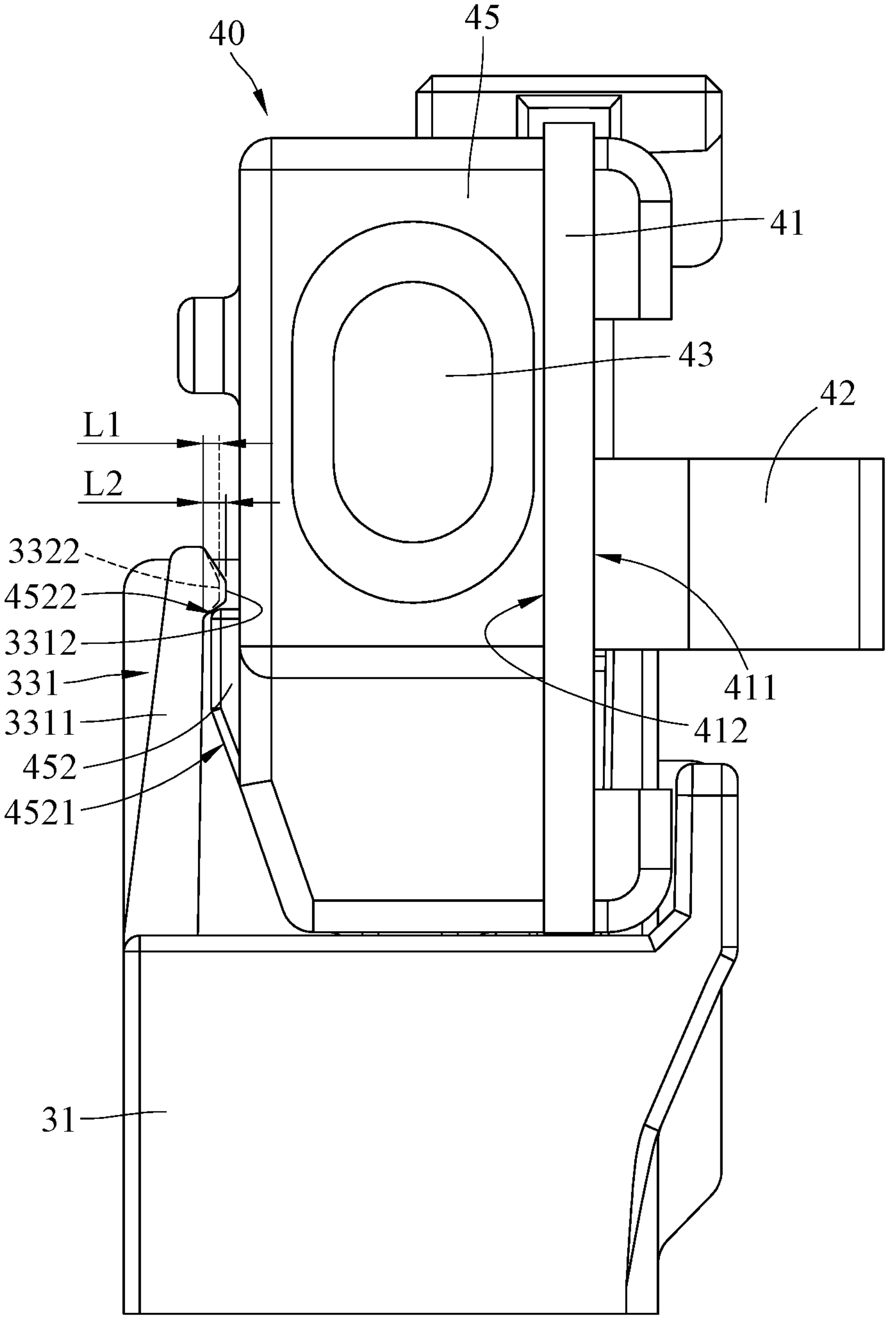
FIG. 5 is a side view of the riser cable and the riser cable holder in FIG. 1.
Figure 6:
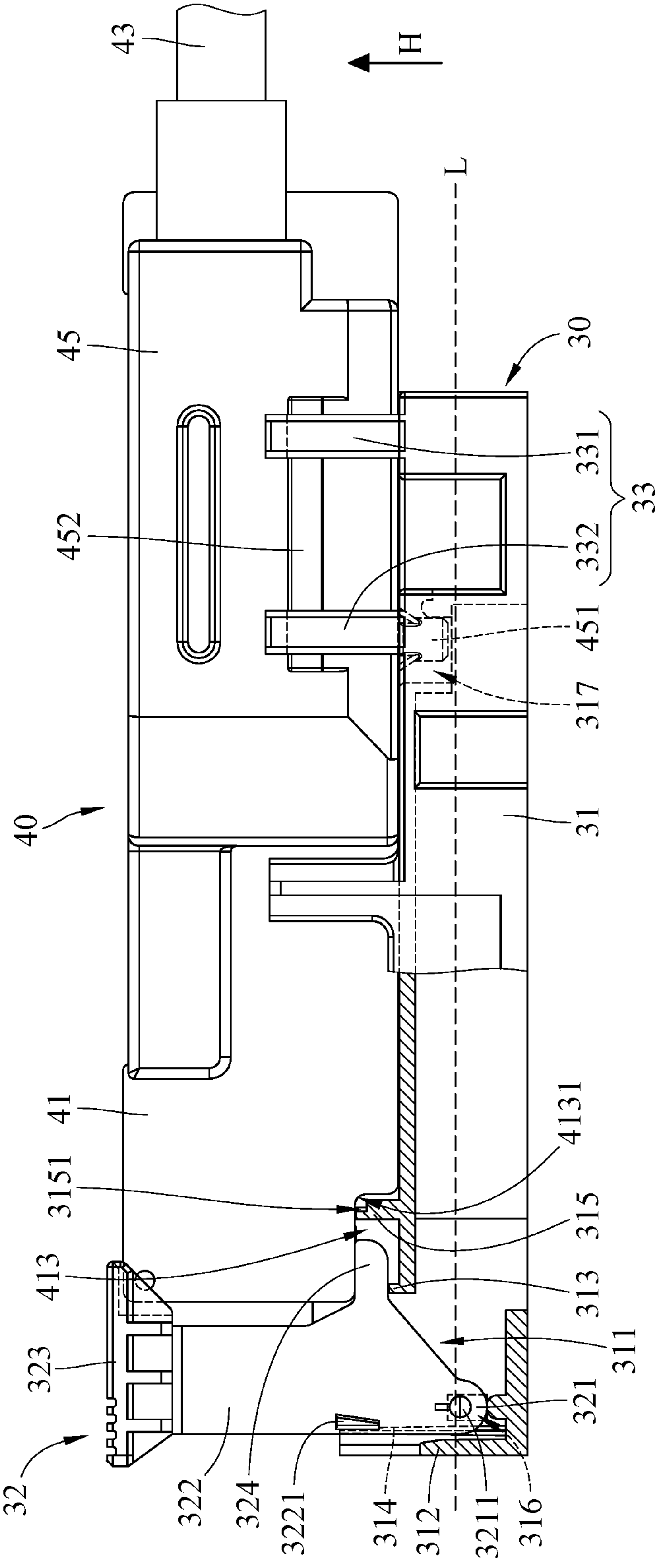
FIG. 6 is a partial cross-sectional view of the riser cable and the riser cable holder in FIG. 1.

Then, referring to FIGS. 3 to 6, FIG. 3 is a partial and enlarged exploded view of the riser cable holder 30 in FIG. 2, FIG. 4 is a partial and enlarged exploded view of the riser cable holder 30 and the riser cable 40 in FIG. 2, FIG. 5 is a side view of the riser cable 40 and the riser cable holder 30 in FIG. 1, and FIG. 6 is a partial cross-sectional view of the riser cable 40 and the riser cable holder 30 in FIG. 1.

The riser cable holder 30 includes a main body 31, a first holder 32 and a second holder 33. The main body 31 is fixed in the casing 10 via screws (now shown). The main body 31 includes a first portion 31A and a second portion 31B connected to each other. The first portion 31A of the main body 31 has an accommodation recess 311 and two inner surfaces 3111 located opposite to each other and forming the accommodation recess 311. In addition, the first portion 31A of the main body 31 further has a first blocking portion 312, a second blocking portion 313, two first contact ribs 314, a support structure 315 and two shaft holes 316. The first blocking portion 312 is located at one side of the accommodation recess 311, and the second blocking portion 313 and the first blocking portion 312 are spaced apart from each other. The two first contact ribs 314 protrude from the two inner surfaces 3111, respectively, and are located between the first blocking portion 312 and the second blocking portion 313. The support structure 315 is located in the accommodation recess 311, and is located one side of the second blocking portion 313 located farther away from the two first contact ribs 314. The support structure 315 has a first recess 3151. The two shaft holes 316 are respectively located at the inner surface 3111 of the main body 31. The second portion 31B of the main body 31 has a positioning hole 317. The purposes of the accommodation recess 311, the first blocking portion 312, the second blocking portion 313, the first contact ribs 314, the support structure 315, the shaft holes 316 and the positioning hole 317 will be introduced later.

The first holder 32 and the second holder 33 are respectively connected to different positions of the main body 31, and the first holder 32 and the second holder 33 are in asymmetric arrangement relative to the main body 31, which may represent that the structures of the first holder 32 and the second holder 33 are asymmetric relative to a center of the main body 31, and the positions of the first holder 32 and the second holder 33 are asymmetric relative to the center of the main body 31. The following paragraphs will introduce the first holder 32 and the second holder 33 in detail.

The first holder 32 includes a mount portion 321, an extension portion 322 and a holding portion 323. In addition, the first holder 32 may further include a pushing portion 324. The mount portion 321 and the holding portion 323 are respectively connected to two opposite ends of the extension portion 322, the pushing portion 324 and the holding portion 323 protrude from the extension portion 322 along a same direction, and the pushing portion 324 is spaced apart from the holding portion 323 and is located closer to the mount portion 321 than the holding portion 323. The mount portion 321 and a part of the extension portion 322 are located in the accommodation recess 311 and are located between the two inner surfaces 3111. The mount portion 321 has two shafts 3211 located opposite to each other, and the two shafts 3211 are mounted in the two shaft holes 316 of the first portion 31A of the main body 31, such that the mount portion 321 is pivotable relative to the main body 31. The first blocking portion 312 and the second blocking portion 313 of the main body 31 of the riser cable holder 30 respectively correspond to the extension portion 322 and the pushing portion 324 of the first holder 32 for limiting a pivotable range of the first holder 32. In other words, the first blocking portion 312 and the second blocking portion 313 of the main body 31 of the riser cable holder 30 limit the first holder 32 to be merely pivotable between an engagement position (e.g., the position of the first holder 32 shown in FIG. 6) and a disengagement position (e.g., the position of the first holder 32 shown in FIG. 7).

In this embodiment, the extension portion 322 of the first holder 32 has two second contact ribs 3221 located opposite to each other, and the two second contact ribs 3221 are configured to be respectively in contact with the two first contact ribs 314 of the main body 31 of the riser cable holder 30.

The second holder 33 includes a first hook 331 and a second hook 332. The first hook 331 includes a first connection arm 3311 and a first engagement block 3312. One end of the first connection arm 3311 is connected to the main body 31, and the first engagement block 3312 protrudes from another end of the first connection arm 3311 located farther away from the main body 31. The second hook 332 includes a second connection arm 3321 and a second engagement block 3322. One end of the second connection arm 3321 is connected to the main body 31 and is located between the first hook 331 and the first holder 32, and the second engagement block 3322 protrudes from another end of the second connection arm 3321 located farther away from the main body 31. As shown in FIGS. 4 and 5, a length L1 that the second engagement block 3322 of the second hook 332 protrudes from the second connection arm 3321 is, for example, smaller than a length L2 that the first engagement block 3312 of the first hook 331 protrudes from the first connection arm 3311.

In this embodiment, the first engagement block 3312 has a first inclined pushed surface 33121 and a first inclined contact surface 33122. The first inclined pushed surface 33121 and the first inclined contact surface 33122 respectively face different directions. The second engagement block 3322 has a second inclined pushed surface 33221 and a second inclined contact surface 33222. The second inclined pushed surface 33221 and the second inclined contact surface 33222 respectively face different directions.

The riser cable 40, for example, supports any generation of an expansion card, such as a PCIe 4.0 or PCIe 5.0 expansion card. The riser cable 40 includes a circuit board 41, a main electrical connector 42, a cable 43, a sub electrical connector 44 (shown in FIG. 1) and a cover 45. The circuit board 41 has a first surface 411, a second surface 412 and a second recess 413. The first surface 411 and the second surface 412 are located opposite to each other, and the second recess 413 is recessed from an edge of the circuit board 41. The main electrical connector 42 is disposed on the first surface 411 of the circuit board 41. One end of the cable 43 is disposed on the second surface 412 of the circuit board 41, and another end of the cable 43 is connected to the sub electrical connector 44. As shown in FIG. 1, the sub electrical connector 44 is assembled with the electrical connector 21 of the motherboard 20, such that the circuit board 41 is electrically connected to the motherboard 20 via the cable 43. The cover 45 is disposed on the circuit board 41 and covers a part of the cable 43 for protecting a portion of the cable 43 that is connected to the circuit board 41. The cover 45 of the riser cable 40 has a positioning pillar 451 and an elongated rib 452, and the elongated rib 452 has an inclined pushing surface 4521 and a curved pushing surface 4522 separated from each other, and the purposes of the inclined pushing surface 4521 and the curved pushing surface 4522 of the elongated rib 452 of the cover 45 will be introduced later.

As shown in FIGS. 4 to 6, when the riser cable 40 is mounted on the riser cable holder 30, the positioning pillar 451 of the riser cable 40 is inserted into the positioning hole 317 of the main body 31, the circuit board 41 of the riser cable 40 is partially located in the accommodation recess 311 of the main body 31, the support structure 315 of the main body 31 is located in the second recess 413 of the circuit board 41 of the riser cable 40 and supports the circuit board 41, the first recess 3151 of the support structure 315 corresponds to an inner edge 4131 of the second recess 413 of the circuit board 41. In addition, the first holder 32 is in the engagement position, the two second contact ribs 3221 of the extension portion 322 of the first holder 32 are respectively in contact with the two first contact ribs 314 of the main body 31, the pushing portion 324 of the first holder 32 is located in the second recess 413 of the circuit board 41, one side of the pushing portion 324 of the first holder 32 is in contact with the second blocking portion 313, and another side of the pushing portion 324 and the holding portion 323 are respectively in contact with two opposite sides of the riser cable 40, such that the first holder 32 holds the circuit board 41. Moreover, the first engagement block 3312 of the first hook 331 and the second engagement block 3322 of the second hook 332 of the second holder 33 are engaged with the elongated rib 452 of the cover 45 of the riser cable 40, such that the first inclined contact surface 33122 of the first engagement block 3312 and the second inclined contact surface 33222 of the second engagement block 3322 face the curved pushing surface 4522 of the elongated rib 452.

In this embodiment, the positioning pillar 451 of the riser cable 40 is inserted into the positioning hole 317 of the main body 31, which can limit a horizontal movement of the riser cable 40 in a long axis L of the main body 31. In addition, the holding portion 323 of the first holder 32 and the first hook 331 and the second hook 332 of the second holder 33 of the riser cable holder 30 can limit a vertical movement of the riser cable 40 along a height direction H of the main body 31.

Note that the positioning pillar 451 of the riser cable 40 and the positioning hole 317 of the main body 31 are optional structures. In some other embodiments, the riser cable may not have the positioning pillar, the main body may not have the positioning hole, and the limitation to the horizontal movement of the riser cable may be achieved by other suitable structures.

Moreover, the second contact ribs 3221 of the extension portion 322 of the first holder 32 are respectively in contact with the first contact ribs 314 of the main body 31, which can prevent the first holder 32 from being pivoted towards the disengagement position for ensuring the first holder 32 to be maintained in the engagement position and hold the circuit board 41 of the riser cable 40.

Note that the first contact ribs 314 of the main body 31 and the second contact rib 3221 of the extension portion 322 of the first holder 32 are optional structures. In some other embodiments, the main body may not have the first contact rib, the extension portion of the first holder may not have the second contact rib, and the first holder may be restricted in the engagement position using other suitable structures.

In this embodiment, the first recess 3151 of the support structure 315 can prevent the support structure 315 from interfering with the inner edge 4131 of the second recess 413 of the circuit board 41 for ensuring the circuit board 41 to be supported by the support structure 315 horizontally.

Note that the first recess 3151 of the support structure 315 is an optional structure. When the manufacturing precision of the support structure and the circuit board are high, and thus there is no interference between the support structure and the inner edge of the second recess of the circuit board, the first recess of the support structure may be omitted. On the other hand, the second recess of the circuit board is an optional structure; in some other embodiments, the circuit board may not have the second recess, and the support structure of the main body may be omitted correspondingly.

As shown in FIG. 1, the expansion card 50 is, for example, any generation of expansion card, such as a PCIe 4.0 or PCIe 5.0 expansion card 50. The expansion card 50 is inserted into the main electrical connector 42 on the circuit board 41 of the riser cable 40, such that the expansion card 50 is electrically connected to the motherboard 20 via the circuit board 41 and the cable 43 of the riser cable 40.

Figure 7:
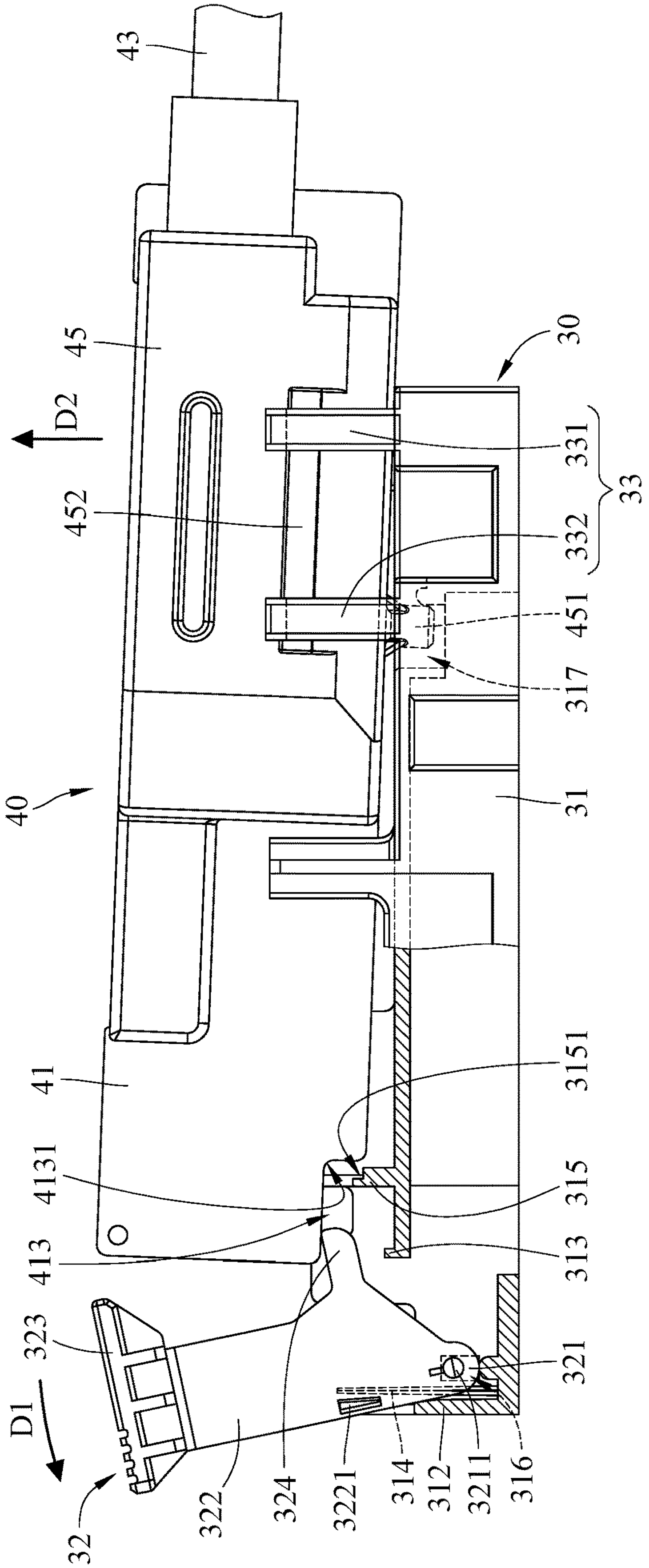
FIG. 7 is a partial cross-sectional view of the riser cable and the riser cable holder in FIG. 6 when a first holder of the riser cable holder is operated.

Then, referring to FIGS. 4, 6 and 7. FIG. 7 is a partial cross-sectional view of the riser cable 40 and the riser cable holder 30 in FIG. 6 when the first holder 32 of the riser cable holder 30 is operated.

When a user desires to remove the riser cable 40 from the riser cable holder 30, the user can operate the holding portion 323 of the first holder 32 along a direction D1 to drive the second contact ribs 3221 of the extension portion 322 of the first holder 32 to climb over the first contact ribs 314 of the main body 31 for pivoting the first holder 32 towards the disengagement position from the engagement position. During the movement of the first holder 32 towards the disengagement position, the holding portion 323 is gradually detached from the circuit board 41, and the pushing portion 324 of the first holder 32 lifts up one side of the circuit board 41 of the riser cable 40. During the upward movement of one side of the circuit board 41, since the protruding length of the second engagement block 3322 of the second hook 332 is smaller than the protruding length of the first engagement block 3312 of the first hook 331, the curved pushing surface 4522 of the elongated rib 452 of the cover 45 of the riser cable 40 presses against the second inclined contact surface 33222 of the second hook 332 so as to push the second hook 332 away and disengage the second hook 332 from the cover 45, and the first engagement block 3312 of the first hook 331 is maintained to be engaged with the cover 45. When the extension portion 322 of the first holder 32 is in contact with the first blocking portion 312 of the main body 31, the first holder 32 is unable to be further pivoted along the direction D1 so as to be positioned in the disengagement position, and the holding portion 323 of the first holder 32 has been disengaged from the circuit board 41. At this moment, the riser cable holder 30 merely leaves the first hook 331 to be still engaged with the cover 45 of the riser cable 40, and thus the user can pull the riser cable 40 along a direction D2 to force the curved pushing surface 4522 of the elongated rib 452 of the cover 45 of the riser cable 40 to press against the first inclined contact surface 33122 of the first hook 331 for pushing the first hook 331 away and disengaging the first hook 331 from the cover 45. As a result, the riser cable 40 is removed from the riser cable holder 30.

Figure 8:
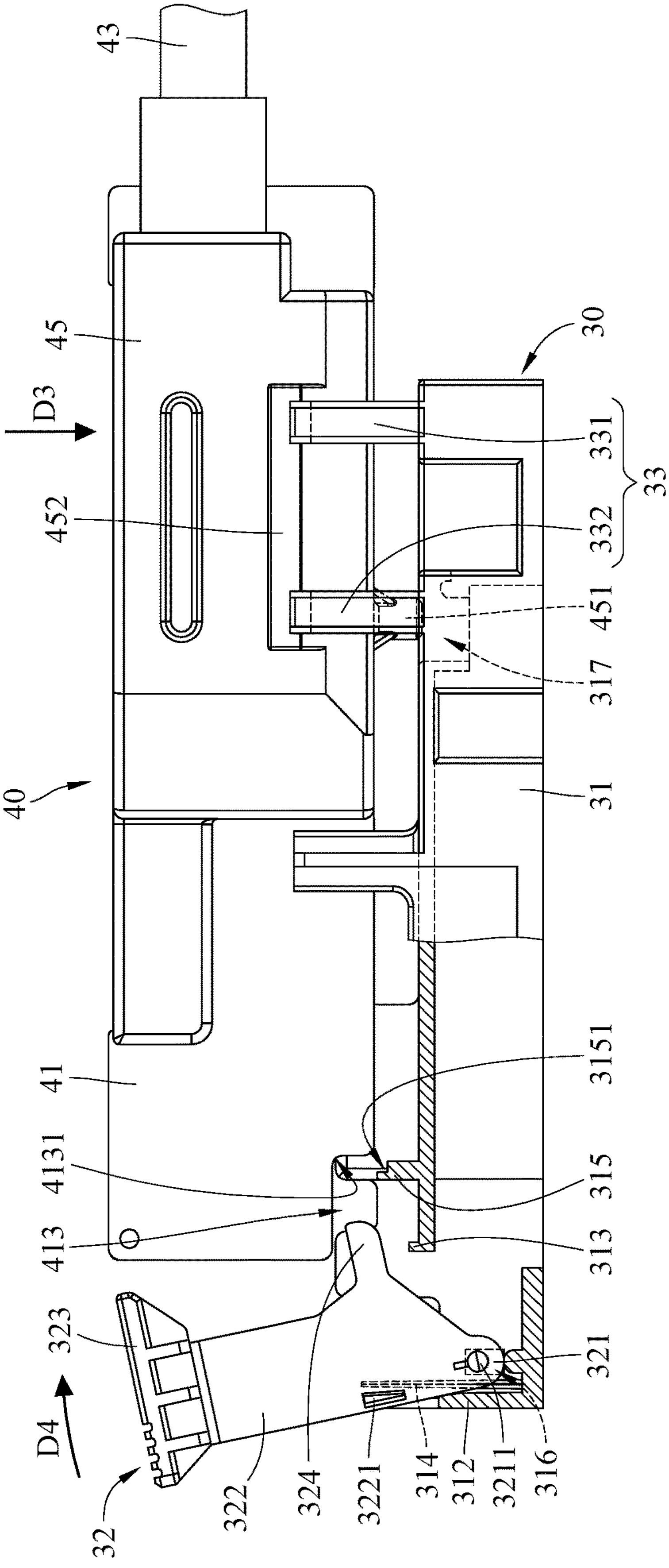
FIGS. 8 and 9 are respectively partial cross-sectional view and side view showing the installation of the riser cable onto the riser cable holder in FIG. 1.
Figure 9:
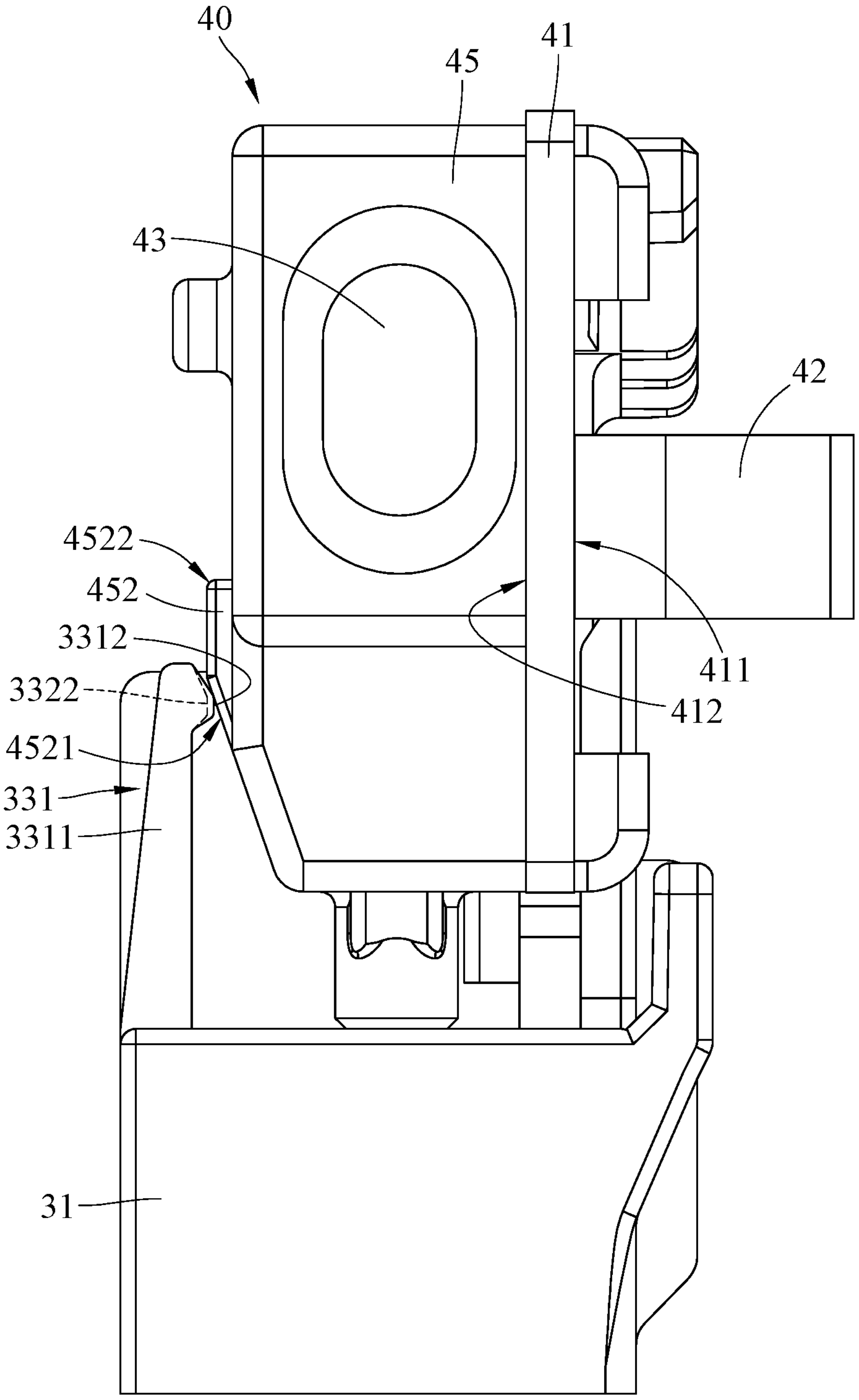

Then, referring to FIGS. 4, 8 and 9, FIGS. 8 and 9 are respectively partial cross-sectional view and side view showing the installation of the riser cable 40 onto the riser cable holder 30 in FIG. 1.

When the user desires to install the riser cable 40 onto the riser cable holder 30, the user can position the first holder 32 to be in the disengagement position for creating an installation path for the riser cable 40 in advance. Then, the positioning pillar 451 of the riser cable 40 is aligned with the positioning hole 317 of the main body 31, the inclined pushing surface 4521 of the elongated rib 452 of the cover 45 of the riser cable 40 contacts the first inclined pushed surface 33121 of the first engagement block 3312 of the first hook 331 and the second inclined pushed surface 33221 of the second engagement block 3322 of the second hook 332, and one side of the circuit board 41 of the riser cable 40 is aligned with the pushing portion 324 of the first holder 32. Then, the riser cable 40 is pressed downwards along a direction D3, such that the elongated rib 452 of the cover 45 of the riser cable 40 pushes the first hook 331 and the second hook 332 away, and the first holder 32 is pivoted along a direction D4 simultaneously. As a result, after the positioning pillar 451 of the cover 45 of the riser cable 40 is inserted into the positioning hole 317 of the main body 31, the first holder 32 is moved to be in the engagement position so as to hold the circuit board 41 of the riser cable 40, and the first hook 331 and the second hook 332 are engaged with the elongated rib 452 of the cover 45 of the riser cable 40. Accordingly, the riser cable 40 is installed onto the riser cable holder 30.

In this embodiment, the riser cable 40 is installed on the main body 31 of the riser cable holder 30 and held by the first holder 32 and the second holder 33 of the riser cable holder 30 which are in asymmetric arrangement relative to the main body 31, and thus the riser cable 40 can be removed from/installed on the riser cable holder 30 via a toolless manner. Therefore, compared to a case that a riser cable is fixed to a riser cable holder via screws, this embodiment can save time spending on removing/installing the screws and a tool for removing/installing the screws, reduce the chance in damaging the riser cable during the removal/installation of the screws, and reduce the material cost of screws. In addition, even if the riser cable holder 30 is located at a narrow space, the riser cable 40 can be easily removed from/installed on the riser cable holder 30.

In addition, since the riser cable 40 is secured on the riser cable holder 30 without screws, there is no need to arrange holes on the circuit board 41 of the riser cable 40 for the installation of the screws. Therefore, the area on the circuit board 41 for the arrangement of circuits or electronic components will not be occupied by such holes.

In addition, the main body 31, the first holder 32 and the second holder 33 of the riser cable holder 30 can be made of recycled plastic materials, thereby achieving the requirements of Environment, Social and Governance (i.e., ESG).

In this embodiment, when the first hook 331 and the second hook 332 of the second holder 33 are engaged with the elongated rib 452 of the cover 45 of the riser cable 40, the first inclined contact surface 33122 of the first hook 331 and the second inclined contact surface 33222 of the second hook 332 face the curved pushing surface 4522 of the elongated rib 452 of the cover 45, which not only enables the first hook 331 and the second hook 332 to firmly hold the riser cable 40, but also allows the elongated rib 452 of the cover 45 to push the first hook 331 and the second hook 332 away easily during the removal of the riser cable 40 from the riser cable holder 30, thereby facilitating the removal of the riser cable 40 from the riser cable holder 30.

Moreover, the cooperation of the inclined pushing surface 4521 of the elongated rib 452 of the cover 45 of the riser cable 40, the first inclined pushed surface 33121 of the first hook 331 and the second inclined pushed surface 33221 of the second hook 332 enables the elongated rib 452 of the cover 45 of the riser cable 40 to push the first hook 331 and the second hook 332 away easily during the installation of the riser cable 40 onto the riser cable holder 30, thereby facilitating the installation of the riser cable 40 onto the riser cable holder 30.

On the other hand, the length L1 that the second engagement block 3322 protrudes from the second connection arm 3321 is smaller than the length L2 that the first engagement block 3312 protrudes from the first connection arm 3311, which makes the holding strength of the second engagement block 3322 applied to the riser cable 40 smaller than the holding strength of the first engagement block 3312 applied to the riser cable 40. Therefore, when the pushing portion 324 of the first holder 32 lifts up one side of the riser cable 40, the second engagement block 3322 is disengaged from the riser cable 40 in advance, but the first engagement block 3312 is maintained to be engaged with the riser cable 40 so as to temporarily position another side of the riser cable 40.

Note that the length L1 that the second engagement block 3322 protrudes from the second connection arm 3321 is not restricted to being smaller than the length L2 that the first engagement block 3312 protrudes from the first connection arm 3311. In some other embodiments, the length that the second engagement block protrudes from the second connection arm may be equal to the length that the first engagement block protrudes from the first connection arm.

On the other hand, the second hook 332 is an optional structure; in some other embodiments, the second holder may not include the second hook but merely include the first hook. In addition, the second holder 33 is not restricted to hook structures and may be modified to other suitable structures according to actual requirements. Moreover, the second holder is not restricted to being engaged with the cover of the riser cable; in some other embodiments, the riser cable may not include the cover, and the second holder may be detachably engaged with the circuit board.

In this embodiment, the pushing portion 324 of the first holder 32 can lift up the riser cable 40 when the first holder 32 is operated for removing the riser cable 40 from the riser cable holder 30, and the pushing portion 324 of the first holder 32 can be moved back to the engagement position during the installation of the riser cable 40. Note that the pushing portion 324 of the first holder 32 is an optional structure and may be omitted in some other embodiments.

In addition, the first holder 32 is not restricted to a pivotable component; in some other embodiments, the first holder may not be a pivotable component but rather an elastically deformable component for achieving detachable engagement with the riser cable. Therefore, the first blocking portion and the second blocking portion of the main body of the riser cable holder may be omitted correspondingly.

On the other hand, the accommodation recess 311 of the riser cable holder 30 is an optional structure and may be omitted in some other embodiments.

Figure 10:
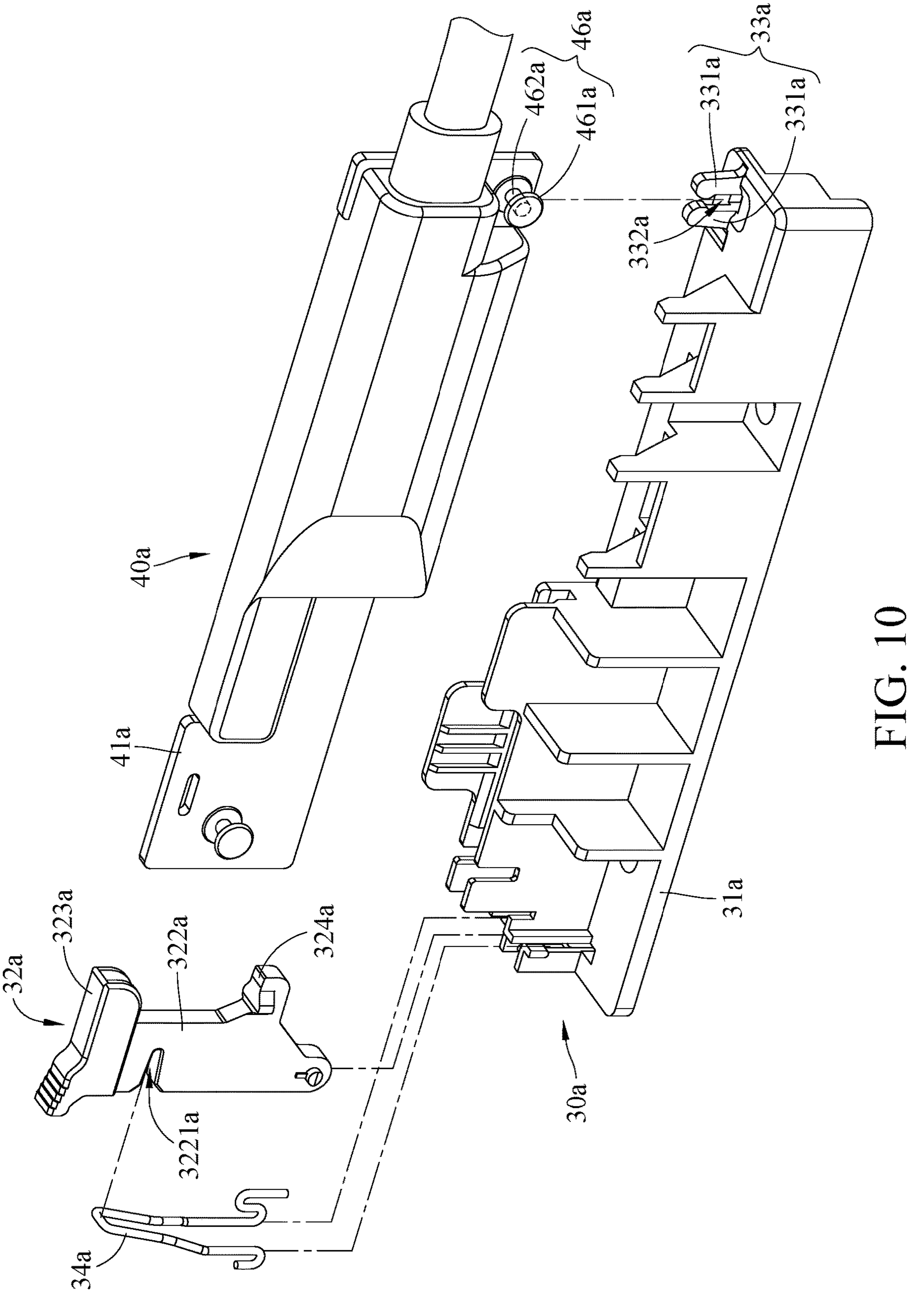
FIG. 10 is an exploded view of a riser cable and a riser cable holder according to a second embodiment of the disclosure.
Figure 11:
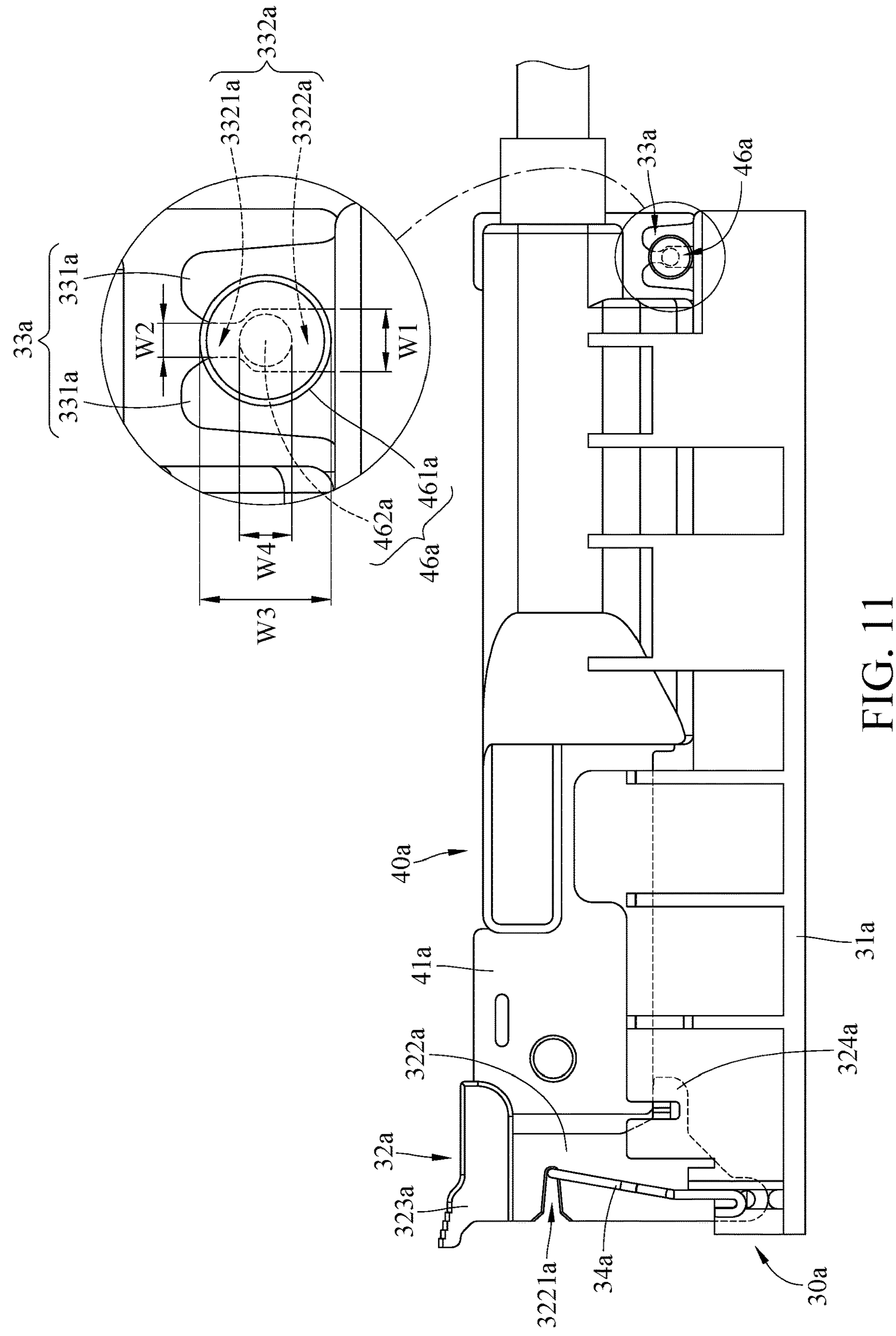
FIG. 11 is a front view of the riser cable and the riser cable holder in FIG. 10.

Then, referring to FIGS. 10 and 11, FIG. 10 is an exploded view of a riser cable 40*a* and a riser cable holder 30*a* according to a second embodiment of the disclosure, and FIG. 11 is a front view of the riser cable 40*a* and the riser cable holder 30*a* in FIG. 10.

The riser cable holder 30*a* of this embodiment is similar to the riser cable holder 30 of the previous embodiment, the main differences between them are structures of the second holder and the riser cable cooperated with each other, and there is an elastic component provided on the first holder additionally. The following paragraphs will mainly introduce the aforementioned differences between the riser cable holder 30*a* of this embodiment and the riser cable holder 30 of the previous embodiment, and the same or similar parts between them will not be repeatedly described hereinafter.

In this embodiment, a second holder 33*a* of the riser cable holder 30*a* includes two elastic arms 331*a*. The two elastic arms 331*a* are connected to the main body 31*a* and are spaced apart from each other, and an engagement recess 332*a* is formed between the two elastic arms 331*a*. The engagement recess 332*a* has a narrow portion 3321*a* and a wide portion 3322*a* connected to each other, and a width W1 of the wide portion 3322*a* is greater than a width W2 of the narrow portion 3321*a*.

The riser cable 40*a* includes a circuit board 41*a* and an engagement component 46*a*. The engagement component 46*a* includes a head portion 461*a* and a body portion 462*a* connected to each other, and one end of the body portion 462*a* located farther away from the head portion 461*a* is disposed on the circuit board 41*a*. A width W3 of the head portion 461*a* is greater than a width W4 of the body portion 462*a* and the width W1 of the wide portion 3322*a* of the engagement recess 332*a*, and the width W4 of the body portion 462*a* is greater than the width W2 of the narrow portion 3321*a* of the engagement recess 332*a*. The body portion 462*a* of the engagement component 46*a* is located in the wide portion 3322*a* of the engagement recess 332*a*, and the two elastic arms 331*a* are located between the head portion 461*a* of the engagement component 46*a* and the circuit board 41*a*, such that the engagement component 46*a* is detachably engaged with the engagement recess 332*a* of the second holder 33*a*.

In this embodiment, the riser cable holder 30*a* further includes an elastic component 34*a*, and an extension portion 322*a* of a first holder 32*a* has a mount recess 3221*a*. The elastic component 34*a* is, for example, an elastically deformable metal strip. Two opposite ends of the elastic component 34*a* are fixed to the main body 31*a* of the riser cable holder 30*a*, and the elastic component 34*a* is partially engaged with the mount recess 3221*a* of the extension portion 322*a* of the first holder 32*a*. The elastic component 34*a* is configured to force the first holder 32*a* to move towards an engagement position.

Figure 12:
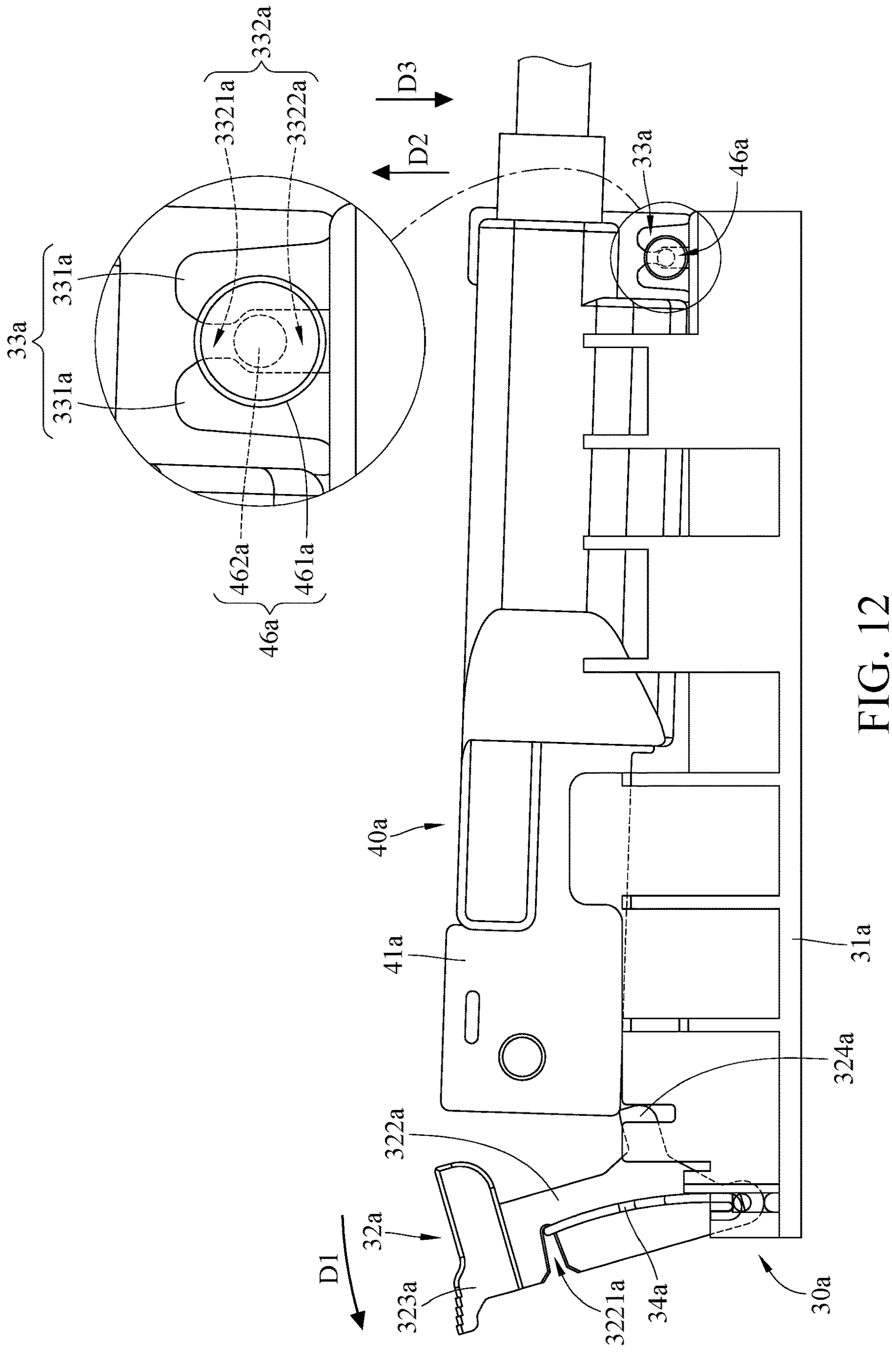
FIG. 12 is a front view of the riser cable and the riser cable holder in FIG. 11 when a first holder of the riser cable holder is operated.

Then, referring to FIG. 12, FIG. 12 is a front view of the riser cable and the riser cable holder in FIG. 11 when a first holder of the riser cable holder is operated.

When a user desires to remove the riser cable 40*a* from the riser cable holder 30*a*, the user can operate the holding portion 323*a* of the first holder 32*a* along a direction D1 to pivot the first holder 32*a* from the engagement position towards the disengagement position and accumulate a rebound force of the elastic component 34*a*. During the movement of the first holder 32*a* towards the disengagement position, the pushing portion 324*a* of the first holder 32*a* forces the riser cable 40*a* to pivot about the engagement component 46*a* so as to lift up one side of the circuit board 41*a* of the riser cable 40*a*. Then, the user can pull the riser cable 40*a* along a direction D2, such that the body portion 462*a* of the engagement component 46*a* forces the two elastic arms 331*a* to elastically deform outwards and thus is released from the two elastic arms 331*a*. As a result, the riser cable 40*a* is removed from the riser cable holder 30*a*.

In contrast, when the user desires to install the riser cable 40*a* onto the riser cable holder 30*a*, the user can hold the first holder 32*a* to be in the disengagement position by one hand so as to create an installation path for the riser cable 40*a*. Then, the body portion 462*a* of the engagement component 46*a* of the riser cable 40*a* is aligned with the engagement recess 332*a* of the second holder 33*a*. Then, one side of the riser cable 40*a* is pressed downwards along a direction D3, such that the body portion 462*a* of the engagement component 46*a* of the riser cable 40*a* is engaged into the engagement recess 332*a* of the second holder 33*a*, and another side of the riser cable 40*a* is in contact with the pushing portion 324*a* of the first holder 32*a*. Then, the user can release the first holder 32*a*, such that the elastic component 34*a* automatically forces the first holder 32*a* to pivot from the disengagement position towards the engagement position, thereby forcing the first holder 32*a* to engage with the circuit board 41*a* of the riser cable 40*a*.

Note that the elastic component 34*a* is an optional component and may be omitted or provided according to actual requirements. In addition, in one embodiment, the elastic component may be provided on the first holder 32 of the riser cable holder 30 of the previous embodiment.

According to the server and the riser cable holders as discussed in the above embodiments, the riser cable is installed on the main body of the riser cable holder and held by the first holder and the second holder of the riser cable holder which are in asymmetric arrangement relative to the main body, and thus the riser cable can be removed from/installed on the riser cable holder via a toolless manner. Therefore, compared to a case that a riser cable is fixed to a riser cable holder via screws, this embodiment can save time spending on removing/installing the screws and a tool for removing/installing the screws, reduce the chance in damaging the riser cable during the removal/installation of the screws, and reduce the material cost of screws. In addition, even if the riser cable holder is located at a narrow space, the riser cable can be easily removed from/installed on the riser cable holder.

In addition, since the riser cable is secured on the riser cable holder without screws, there is no need to arrange holes on the circuit board of the riser cable for the installation of the screws. Therefore, the area on the circuit board for the arrangement of circuits or electronic components will not be occupied by such holes.

Moreover, the main body, the first holder and the second holder of the riser cable holder can be made of recycled plastic materials, thereby achieving the requirements of Environment, Social and Governance (i.e., ESG).

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A server, comprising:

a casing;

a motherboard, located in the casing;

a riser cable holder, comprising a main body, a first holder and a second holder, wherein the main body is fixed in the casing, the first holder and the second holder are configured to be respectively connected to different positions of the main body, and the first holder and the second holder are in asymmetric arrangement relative to the main body;

a riser cable, configured to be mounted on the main body and electrically connected to the motherboard, wherein the first holder and the second holder are configured to be detachably engaged with the riser cable; and an expansion card, inserted into a main electrical connector on a circuit board of the riser cable.

2. The server according to claim 1, wherein the first holder comprises a mount portion, an extension portion and a holding portion, the mount portion and the holding portion are configured to be respectively connected to two opposite ends of the extension portion, the mount portion is pivotably disposed on the main body, and the holding portion is configured to engage with the riser cable.

3. The server according to claim 2, wherein the first holder further comprises a pushing portion, the pushing portion and the holding portion protrude from the extension portion along a same direction, the pushing portion is spaced apart from the holding portion and is located closer to the mount portion than the holding portion, and the holding portion and the pushing portion are configured to be respectively in contact with two opposite sides of the riser cable.

4. The server according to claim 3, wherein the main body has a first blocking portion and a second blocking portion spaced apart from each other, the first blocking portion and the second blocking portion respectively correspond to the extension portion and the pushing portion for limiting a pivotable range of the first holder.

5. The server according to claim 2, wherein the main body has an accommodation recess, two inner surfaces forming the accommodation recess and two first contact ribs, the two first contact ribs respectively protrude from the two inner surfaces, the mount portion, a part of the extension portion and a part of the riser cable are located in the accommodation recess, the extension portion has two second contact ribs located opposite to each other, and the two second contact ribs are configured to be respectively in contact with the two first contact ribs.

6. The server according to claim 2, wherein the riser cable holder further comprises an elastic component, two opposite ends of the elastic component are respectively fixed to the extension portion of the first holder and the main body, and the elastic component is configured to apply a force to the holding portion of the first holder for moving the holding portion of the first holder towards the riser cable.

7. The server according to claim 1, wherein the riser cable comprises, a cable and a cover, one end of the cable is disposed on the circuit board, the cover is disposed on the circuit board and covers a part of the cable, the cover has an elongated rib, the elongated rib has an inclined pushing surface and a curved pushing surface separated from each other, the second holder comprises a first hook, the first hook comprises a first connection arm and a first engagement block, one end of the first connection arm is connected to the main body, the first engagement block protrudes from another end of the first connection arm located farther away from the main body, the first engagement block has a first inclined pushed surface and a first inclined contact surface, the first inclined pushed surface of the first engagement block is configured to be pushed by the inclined pushing surface of the elongated rib, and the first inclined contact surface of the first engagement block corresponds to the curved pushing surface of the elongated rib.

8. The server according to claim 7, wherein the second holder further comprises a second hook, the second hook comprises a second connection arm and a second engagement block, one end of the second connection arm is connected to the main body and is located between the first hook and the first holder, the second engagement block protrudes from another end of the second connection arm located farther away from the main body, the second engagement block has a second inclined pushed surface and a second inclined contact surface, the second inclined pushed surface of the second engagement block is configured to be pushed by the inclined pushing surface of the elongated rib, and the second inclined contact surface of the second engagement block corresponds to the curved pushing surface of the elongated rib.

9. The server according to claim 8, wherein a length that the second engagement block protrudes from the second connection arm is smaller than a length that the first engagement block protrudes from the first connection arm.

10. The server according to claim 1, wherein the second holder comprises two elastic arms, the two elastic arms are connected to the main body and are spaced apart from each other, an engagement recess is formed between the two elastic arms, the riser cable comprises an engagement component, the engagement component is disposed on the circuit board, and the engagement component is configured to engage with the engagement recess.

11. The server according to claim 10, wherein the engagement recess has a narrow portion and a wide portion connected to each other, a width of the wide portion is greater than a width of the narrow portion, the engagement component comprises a head portion and a body portion connected to each other, one end of the body portion located farther away from the head portion is disposed on the circuit board, a width of the head portion is greater than a width of the body portion and the width of the wide portion of the engagement recess, the width of the body portion is greater than the width of the narrow portion of the engagement recess, the body portion is configured to be located in the wide portion of the engagement recess, and the two elastic arms are located between the head portion of the engagement component and the circuit board.

12. The server according to claim 1, wherein the main body has an accommodation recess and a support structure, the support structure is located in the accommodation recess, a part of the first holder and a part of the riser cable are located in the accommodation recess, the support structure has a first recess, the riser cable has a second recess, the support structure is located in the second recess of the riser cable and supports the riser cable, and the first recess of the support structure corresponds to an inner edge of the second recess of the riser cable.

13. The server according to claim 1, wherein the riser cable has a positioning pillar, the main body has a positioning hole, and the positioning pillar is configured to be inserted into the positioning hole.

14. A riser cable holder, configured to support a riser cable, the riser cable holder comprising:

a main body, configured to support the riser cable;

a first holder; and a second holder, wherein the first holder and the second holder are respectively connected to different positions of the main body, the first holder and the second holder are in asymmetric arrangement relative to the main body, and the first holder and the second holder are configured to be detachably engaged with the riser cable;

wherein the riser cable has a positioning pillar, the main body has a positioning hole, and the positioning pillar is configured to be inserted into the positioning hole.

15. The riser cable holder according to claim 14, wherein the first holder includes a mount portion, an extension portion and a holding portion, the mount portion and the holding portion are respectively connected to two opposite ends of the extension portion, the mount portion is pivotably disposed on the main body, and the holding portion is configured to be detachably engaged with the riser cable.

16. The riser cable holder according to claim 15, wherein the first holder further comprises a pushing portion, the pushing portion and the holding portion protrude from the extension portion along a same direction, the pushing portion is spaced apart from the holding portion and is located closer to the mount portion than the holding portion, and the holding portion and the pushing portion are configured to be respectively in contact with two opposite sides of the riser cable.

17. The riser cable holder according to claim 16, wherein the main body has a first blocking portion and a second blocking portion spaced apart from each other, the first blocking portion and the second blocking portion respectively correspond to the extension portion and the pushing portion for limiting a pivotable range of the first holder.

18. The riser cable holder according to claim 15, wherein the main body has an accommodation recess, two inner surfaces forming the accommodation recess and two first contact ribs, the two first contact ribs respectively protrude from the two inner surfaces, the mount portion, a part of the extension portion and a part of the riser cable are configured to be located in the accommodation recess, the extension portion has two second contact ribs located opposite to each other, and the two second contact ribs are configured to be respectively in contact with the two first contact ribs.

19. The riser cable holder according to claim 14, wherein the second holder comprises a first hook and a second hook, the first hook comprises a first connection arm and a first engagement block, one end of the first connection arm is connected to the main body, the first engagement block protrudes from another end of the first connection arm located farther away from the main body, the second hook comprises a second connection arm and a second engagement block, one end of the second connection arm is connected to the main body and is located between the first hook and the first holder, the second engagement block protrudes from another end of the second connection arm located farther away from the main body, and a length that the second engagement block protrudes from the second connection arm is smaller than a length that the first engagement block protrudes from the first connection arm.

* * * * *